United States Patent
Barber et al.

(10) Patent No.: US 7,296,329 B1
(45) Date of Patent: Nov. 20, 2007

(54) METHOD OF ISOLATION FOR ACOUSTIC RESONATOR DEVICE

(75) Inventors: Bradley Paul Barber, Chatham, NJ (US); Linus Albert Fetter, Morganville, NJ (US); Michael George Zierdt, Belle Mead, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/497,993

(22) Filed: Feb. 4, 2000

(51) Int. Cl.
*H04R 17/00* (2006.01)
*B05D 5/12* (2006.01)
*B44C 1/22* (2006.01)

(52) U.S. Cl. .................. 29/25.35; 29/594; 29/846; 427/100; 216/13

(58) Field of Classification Search ............... 29/25.35, 29/594, 593, 846, DIG. 16; 310/311, 312, 310/313 R; 427/100; 216/13, 41; 252/62.9 R, 252/62.9 PZ
See application file for complete search history.

(56) References Cited

U.S. PATENT DOCUMENTS

| | | |
|---|---|---|
| 4,320,365 A | 3/1982 | Black et al. |
| 4,502,932 A | 3/1985 | Kline et al. |
| 4,556,812 A | 12/1985 | Kline et al. |
| 4,675,123 A * | 6/1987 | Tsunooka et al. ...... 252/62.9 R |
| 4,719,383 A | 1/1988 | Wang et al. |
| 4,890,370 A | 1/1990 | Fukuda et al. |
| 4,988,957 A | 1/1991 | Thompson et al. |
| 5,022,130 A * | 6/1991 | EerNisse et al. ............ 29/25.35 |
| 5,075,641 A | 12/1991 | Weber et al. |
| 5,129,132 A * | 7/1992 | Zdeblick et al. ............ 29/25.35 |
| 5,166,646 A | 11/1992 | Avanic et al. |
| 5,185,589 A | 2/1993 | Krishnaswamy et al. |
| 5,231,327 A | 7/1993 | Ketcham |
| 5,232,571 A | 8/1993 | Braymen |

(Continued)

FOREIGN PATENT DOCUMENTS

JP 6-232671 * 8/1994 ................ 29/25.35

(Continued)

OTHER PUBLICATIONS

Kim S-H et al: "The Fabrication Of Thin-Film Bulk Acoustic Wave Resonators Employing A ZNO/SI Composite Diaphragm Structure Using Poroous Silicon Layer Etching", IEEE Elecron Device Letters, IEEE Service Center, New York, NY, US, vol. 20, No. 3, Mar. 1999 (199-03).

(Continued)

*Primary Examiner*—A. Dexter Tugbang

(57) ABSTRACT

A method of isolating piezoelectric thin film acoustic resonator devices to prevent laterally propagating waves generated by the device from leaving the device and/or interfering with adjacent devices or systems. Specifically, this isolation technique involves the manipulation or isolation of the piezoelectric material layer between the acoustic resonator devices, in an effort to limit the amount of acoustic energy which propagates in a lateral direction away from the device. In one aspect, at least a portion of the piezoelectric material not involved in signal transmission by transduction between RF and acoustic energy is removed from the device. In another aspect, the growth a piezoelectric material is limited to certain regions during fabrication of the device. In a further aspect, the crystal orientation of the piezoelectric material is disrupted or altered during device fabrication so as to form regions having excellent piezoelectric properties and regions exhibiting poor piezoelectric characteristics.

7 Claims, 6 Drawing Sheets

U.S. PATENT DOCUMENTS

| | | |
|---|---|---|
| 5,263,259 A | 11/1993 | Cimador |
| 5,283,458 A | 2/1994 | Stokes et al. |
| 5,294,898 A | 3/1994 | Dworsky et al. |
| 5,303,457 A | 4/1994 | Falkner, Jr. et al. |
| 5,334,960 A | 8/1994 | Penunuri |
| 5,348,617 A | 9/1994 | Braymen |
| 5,367,308 A | 11/1994 | Weber |
| 5,369,862 A * | 12/1994 | Kotani et al. ............... 29/25.35 |
| 5,373,268 A | 12/1994 | Dworsky et al. |
| 5,381,385 A | 1/1995 | Greenstein |
| 5,403,701 A | 4/1995 | Lum et al. |
| 5,404,628 A | 4/1995 | Ketcham |
| 5,438,554 A | 8/1995 | Seyed-Bolorforosh et al. |
| 5,446,306 A | 8/1995 | Stokes et al. |
| 5,552,655 A | 9/1996 | Stokes et al. |
| 5,587,620 A | 12/1996 | Ruby et al. |
| 5,596,239 A | 1/1997 | Dydyk |
| 5,617,065 A | 4/1997 | Dydyk |
| 5,630,949 A | 5/1997 | Lakin |
| 5,646,583 A | 7/1997 | Seabury et al. |
| 5,692,279 A * | 12/1997 | Mang et al. ............... 29/25.35 |
| 5,698,928 A | 12/1997 | Mang et al. |
| 5,702,775 A | 12/1997 | Anderson et al. |
| 5,714,917 A | 2/1998 | Ella |
| 5,760,663 A | 6/1998 | Pradal |
| 5,780,713 A | 7/1998 | Ruby |
| 5,789,845 A | 8/1998 | Wadaka et al. |
| 5,821,833 A | 10/1998 | Lakin |
| 5,853,601 A | 12/1998 | Krishaswamy et al. |
| 5,864,261 A | 1/1999 | Weber |
| 5,868,948 A * | 2/1999 | Fujii et al. ............... 216/41 X |
| 5,872,493 A | 2/1999 | Ella |
| 5,873,153 A | 2/1999 | Ruby et al. |
| 5,873,154 A | 2/1999 | Ylilammi et al. |
| 5,883,575 A | 3/1999 | Ruby et al. |
| 5,884,378 A | 3/1999 | Dydyk |
| 5,894,647 A | 4/1999 | Lakin |
| 5,910,756 A | 6/1999 | Ella |
| 5,928,598 A | 7/1999 | Anderson et al. |
| 5,942,958 A | 8/1999 | Lakin |
| 5,963,856 A | 10/1999 | Kim |
| 6,051,907 A | 4/2000 | Ylilammi |
| 6,060,818 A | 5/2000 | Ruby et al. |
| 6,081,171 A | 6/2000 | Ella |
| 6,087,198 A | 7/2000 | Panasik |
| 6,127,768 A | 10/2000 | Stoner et al. |
| 6,150,703 A | 11/2000 | Cushman et al. |
| 6,185,589 B1 | 2/2001 | Votipka |
| 6,198,208 B1 | 3/2001 | Yano et al. |
| 6,204,737 B1 | 3/2001 | Ella |
| 6,215,375 B1 | 4/2001 | Larson, III et al. |

FOREIGN PATENT DOCUMENTS

| | | |
|---|---|---|
| WO | WO 98/16956 A | 4/1998 |

OTHER PUBLICATIONS

Patent Abstracts of Japan, vol. 1995, No. 09 Oct. 31, 2005 & JP 07 162054 A (Murata Mfg.

Seabury, CW et al; "Thin Film ZnO Based Bulk Acoustic Mode Filters"; Microwave Symposium Digest, 1997; IEEE MIT-S International, Denver, CO, USA, IEEE, US, vol. 1, Jun. 8, 1997 pp. 181-184.

* cited by examiner

PRIOR ART

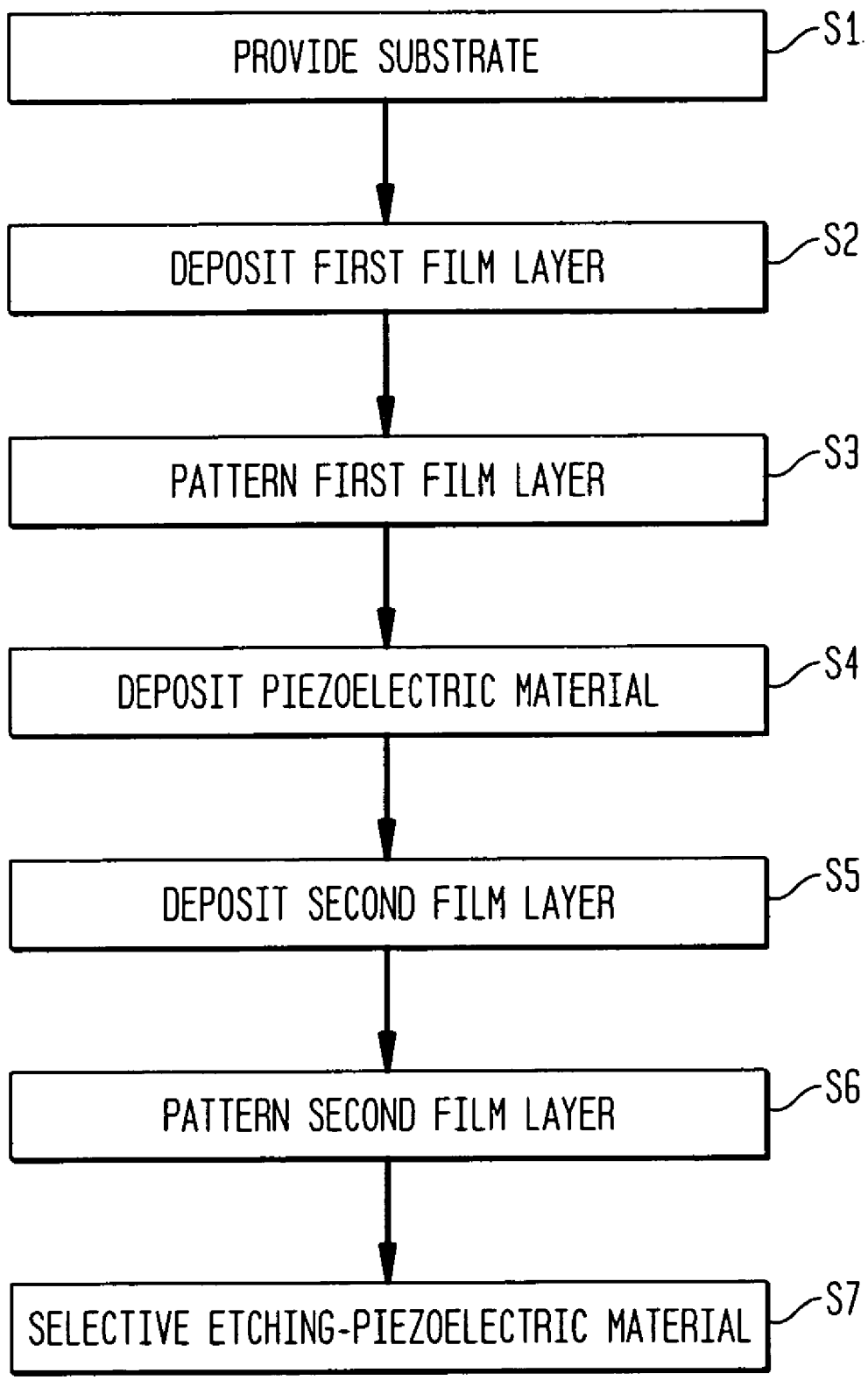

METHOD OF ISOLATION FOR ACOUSTIC RESONATOR DEVICE

FIELD OF THE INVENTION

The present invention relates to bulk acoustic wave devices, more particularly to isolation techniques for limiting the effects of lateral wave propagation undesirably removing energy from and causing coupling between thin film resonator (TFR) devices fabricated on a common substrate.

DESCRIPTION OF THE RELATED ART

In recent years, much research has been performed in the development of bulk acoustic wave devices, primarily for use in cellular, wireless and fiber-optic communications, as well as in computer or computer-related information-exchange or information-sharing systems. There is a trend in such systems for operation at increasingly higher carrier frequencies, principally because the spectrum at lower frequencies has become relatively congested, and also because the permissible bandwidth is greater at higher frequencies. Piezoelectric crystals have provided the basis for bulk acoustic wave devices such as oscillators, resonators and filters, operating at very high radio frequencies (on the order of several gigahertz).

It has been known for some time, of course, that certain crystalline materials have piezoelectric properties. In particular, there is what is sometimes referred to as the direct piezoelectric effect, wherein electrical charges appear on crystal surfaces upon the application of an external stress. There is also a converse piezoelectric effect, wherein the crystal exhibits strain or deformation when an electrical charge is applied by external means to faces of the crystal.

In many high-frequency applications, filters are based on dielectric filled electromagnetic cavity resonators with physical dimensions that are dictated by the wavelength of the resonating wave, be it acoustic or electromagnetic. Due to the interaction between electrical charge, stress, and strain described above, a piezoelectric material acts as a transducer which converts back and forth between electromagnetic and acoustic (i.e., mechanical) waves so it can also be used as an electrically resonant device. The velocity of an acoustic wave, however, is approximately $1/10000$ that of the velocity of an electromagnetic wave. This relationship between the wave's velocity and device dimensions thus allows a reduction of roughly this factor in the size of certain devices, including acoustic resonators, employing this material.

FIG. 1 illustrates a cross-section of a typical acoustic resonator device 100. Device 100 comprises a piezoelectric material 110 interposed between two conductive electrodes 105 and 115, one of which is formed on a substrate 120. In ideal realizations of these acoustic resonators, mechanical oscillations orthogonal to the device surface are excited by an applied electric field Many other types of oscillation are created including combinations of shear, surface, and longitudinal waves. These waves can be created for example by the non-ideal crystalline orientation in a real device, fringing fields at the resonator's edge, mechanical discontinuities at the electrode edges, nonuniform current distributions, etc. These waves, no longer purely longitudinal, carry away acoustic energy, essentially allowing it to "leak out" the sides of the device 100, and/or causing interference with adjacent devices or system components. These energy losses are responsible for a degradation of energy transfer in the device, say being used as an RF bandpass filter, inhibiting device efficiency and performance. Accordingly, there is a need for a method of isolating bulk acoustic wave devices such as acoustic resonators from the detrimental effects that these laterally-generated waves have on device efficiency and performance.

SUMMARY OF THE INVENTION

The present invention provides a method of isolating acoustic resonator devices formed from a piezoelectric material that is interposed between two conductors on a substrate. For example, a region of piezoelectric material surrounding or partially surrounding a device, between at least two devices may be removed, it may be prevented from growing in that region during fabrication of the devices, or it may have a crystal orientation within that region altered. Each of these techniques may reduce the amount of acoustic energy which propagates in a lateral direction away from the device. This loss of acoustic energy may inhibit device efficiency and performance, and could interfere with adjacent or adjoining devices and components.

BRIEF DESCRIPTION OF THE DRAWINGS

The present invention will become fully understood from the detailed description given hereinbelow and the accompanying drawings, wherein like elements represent like reference numerals, which are given by way of illustration only and thus are not limitative of the invention and wherein:

FIG. 2 illustrates an isolation method in accordance with a first embodiment of the present application;

DETAILED DESCRIPTION

Figure 1:
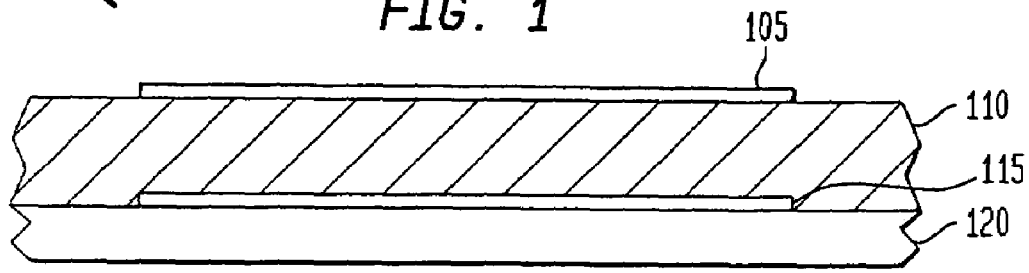
FIG. 1 illustrates a cross-section of a typical thin film resonator (TFR) acoustic resonator device.

The present invention provides a method to limit the loss of device performance due to generation of unwanted lateral waves in acoustic resonator devices. In one aspect of the invention, piezoelectric material not involved in signal transmission (i.e., at least a portion of the piezoelectric material that is not between the electrodes) is removed from the device. In another aspect, growth of piezoelectric material is limited to certain regions during fabrication of the device.

In a further aspect, the crystal orientation of the piezoelectric material is disrupted or altered during device fabrication, so as to form regions where the crystalline orientation is highly ordered (e.g., regions where the crystalline structure exhibits excellent piezoelectric characteristics), and regions where the crystalline orientation is less than highly ordered (i.e., the crystalline structure results in regions having piezoelectric characteristics which are poor as compared to those highly ordered regions. For example, the starting conditions of growth can cause a randomization of the preferred direction of the neighboring crystal grains' piezoelectricity, such that there is a net zero-sum of the piezoelectric effect.

FIG. 2 illustrates the method of isolating an acoustic resonator device in accordance with a first embodiment of the present application. Though there can be a myriad of thin film process steps involved in the batch fabrication of a TFR acoustic resonator device as there is in fabricating any modern integrated circuit, the vast majority of these processes involve repeated applications of three primary operations: deposition, lithography, and etching.

Referring to FIG. 2, initially a base support structure such as a substrate is provided (Step S1). In this case, the base structure is not integral to device operation; it primarily provides mechanical support. The base structure, hereinafter "substrate" may be a silicon wafer substrate, and preferably may include a plurality of alternating acoustic reflecting layers of acoustically mismatched materials such as $SiO_2$ and AlN which are mounted on a solid substrate such as a silicon, quartz, or glass wafer. Further, the substrate may be a membrane which is fabricated by removal of the material beneath it. After providing the substrate, a thin metal film layer (approximately 100 nanometers or $100 \times 10^{-9}$ meters thick) is deposited on the substrate surface (Step S2). The metal film acts as a bottom surface electrode for the acoustic resonator device and is preferably composed of Al, but other conductors may be used as well. This deposition may preferably be performed in a vacuum chamber using one of a variety of thin-film deposition techniques which are known in the art, such as RF sputtering of an insulating target, pulsed DC reactive sputtering of a metallic target, chemical vapor deposition (CVD), molecular beam epitaxy (MBE), etc.

Once the metal film has been deposited, it undergoes a patterning process (Step S3). A lithographic process is employed in which a thin layer of a photo-sensitive, chemically-resistant polymer, or "photo resist", is applied to completely coat the metal film. Exposure to light through a "photo mask", a material or masking layer that has holes or openings at certain locations for light to pass, sensitizes the photo resist such that subsequent immersion in a developer removes only that resist material that was subject to the light. At this point, the sample surface consists of regions where the protective resist layer remains, and regions of un-protected metal.

Figure 3:
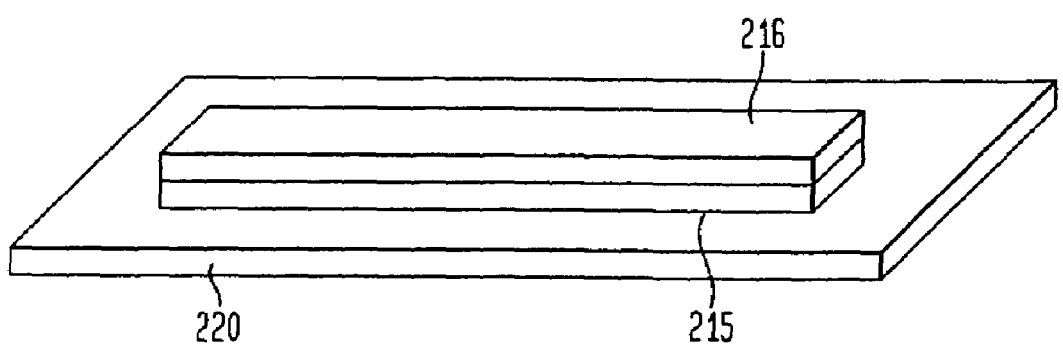
FIG. 3 illustrates a partially fabricated acoustic resonator device.

The patterning process continues with the transfer of this lithographically-defined pattern into the metal layer via an etching process. A number of etching techniques are routinely practiced in the art, including wet chemical etching, reactive ion etching (RIE), and sputter etching. Such processes, through either chemical or physical action, remove any metal which is unprotected by the photo resist, while leaving the resist-coated metal intact, thereby "sculpting" the metallic surface into the desired electrode pattern. An electrode defined by such a process is illustrated in FIG. 3. Resist 216 has protected metal layer 215 during the removal of all unprotected material on substrate 220. When the remaining photo resist material 216 is removed by a solvent, a metallic layer 215 defined by the desired pattern remains.

The semi-completed device is then returned to the vacuum chamber for the deposition of an active piezoelectric material film (Step S4). Similar to the metal deposition alternatives listed above, the piezoelectric layer can be deposited in different ways, such as through RF sputtering of an insulating target, pulsed DC reactive sputtering of a metallic target, chemical vapor deposition (CVD) and molecular beam epitaxy (MBE) for example. This piezoelectric material is preferably Aluminum Nitride (AlN), but may be composed of ZnO or CdS for example. Similar to the metal film, the AlN film is deposited entirely over the substrate, but unlike the metal film it is not patterned, and is subsequently coated with a second thin metal film layer of Al which forms the top electrode of the device (Step S5). This second metal film is patterned and etched with the lithographic process described above (Step S6). Once the photo resist is removed, the structure of the acoustic resonator device is almost complete. Although at this point the device functions as a TFR, there are further advantages to performing the steps described below.

Figure 4:
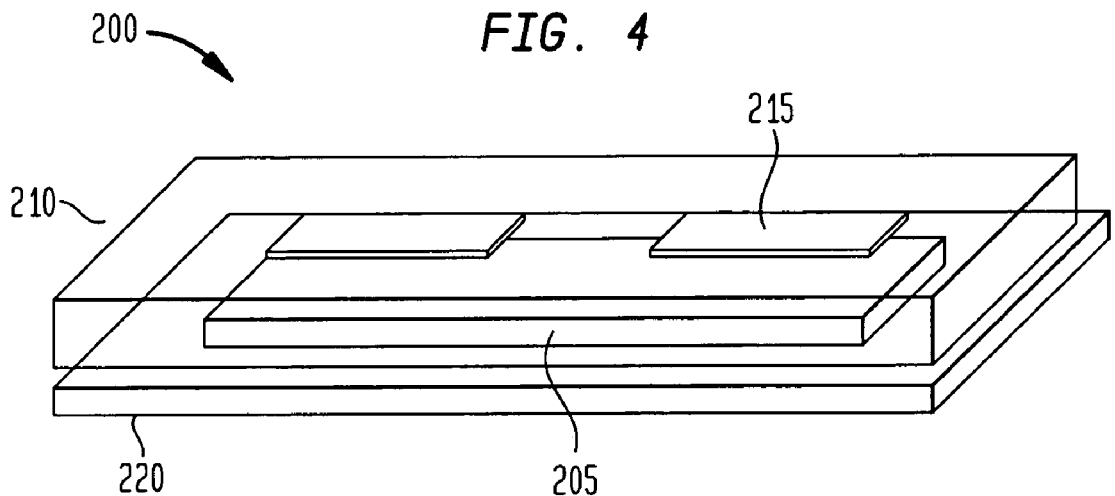
FIG. 4 illustrates an acoustic resonator device prior to undergoing isolation in accordance with the first embodiment of the present application.

FIG. 4 illustrates an acoustic resonator device prior to undergoing isolation in accordance with the first embodiment of the present application. Referring to FIG. 4, there is an acoustic resonator device 200 comprising a substrate 220, and a piezoelectric layer 210 sandwiched by top and bottom metal electrodes 205 and 215. Since layer 210 is continuous (i.e., un-patterned), there is no direct electrical connection to the base metal (bottom electrode 215), and the acoustic resonator device 200 is actually two "cavities" or resonators formed in series. Further, the piezoelectric material within layer 210 is oriented so that an applied electric field will excite bulk acoustic waves, i.e., primarily longitudinal waves which travel perpendicular to the surface of the substrate 220. This mode of propagation differentiates these acoustic resonator devices of FIG. 4 from Surface Acoustic Wave (SAW) devices, where the material and design properties encourage acoustic wave propagation parallel to and along the surface of the substrate.

As discussed above, when an (electromagnetic) RF signal is applied between the electrodes 205 and 215, the piezoelectric layer 210 sandwiched therebetween responds by oscillating as an acoustic wave in the bulk of the material, perpendicular to the substrate 220. This action is analogous to an electrically-activated spring which when excited by an AC signal responds by cycling through vertical compressions and expansions in accordance with the changing electrical signal. In this way, the electrical signal is converted to a mechanical motion orthogonal to the surface of the substrate 220. Nevertheless, this motion is not completely confined to the axis normal to the substrate because of effects like: non-ideal crystal orientation, fringing fields, film roughness, and mechanical boundaries of the resonator. Thus, even in the acoustic resonator device illustrated in FIG. 4, lateral wave motion will be excited which carries energy away that dissipates in a non-recoverable fashion or interferes with neighboring devices on the same substrate. However, the following step can enhance acoustic resonator device performance by limiting the ability of lateral waves to carry away energy.

Referring again to FIG. 2, after device fabrication (completion of Step S6), the piezoelectric layer 210 is subjected to a selective etching process, i.e., a "trenching" process (Step S7). One such trenching process is described in co-pending U.S. patent application Ser. No. 09/497,982, now U.S. Pat. No. 6,306,313, entitled "Selective Etching of Thin Films". Specifically, any piezoelectric material not involved in signal transmission (not between the electrodes 205 and 215) is removed by chemical etching. This etching can be accomplished by wet etching, ion beam milling, or preferably in a reactive ion etch (RIE) chamber employing chlorine chemistry and plasma bombardment to remove material. Again photo-definable resist is used to preserve the regions between electrodes 205 and 215 that should not be etched. Thus, propagation of lateral acoustic modes is limited to the un-etched regions of the device, inhibiting cross-device interference and energy loss.

Figure 5:
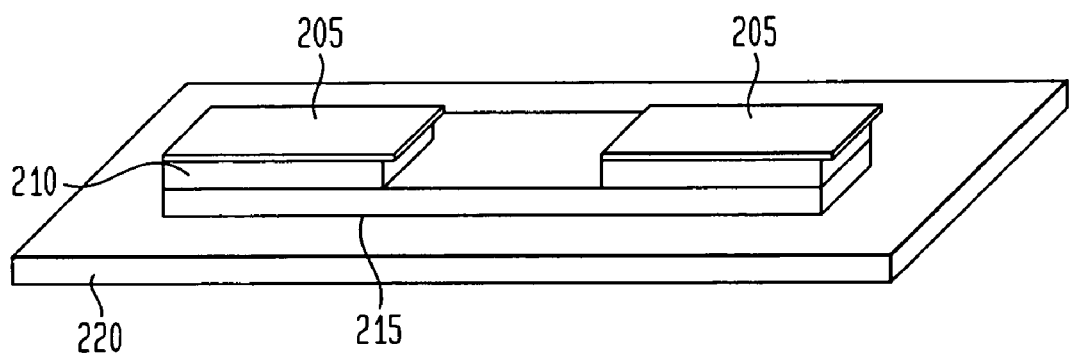
FIG. 5 illustrates the acoustic resonator device of FIG. 4 after isolation in accordance with the first embodiment.

FIG. 5 illustrates the acoustic resonator device after isolation in accordance with the first embodiment. Referring to FIG. 5, it can be seen that after trenching, the edges of the electrodes 205, 215 and piezoelectric layer 210 are matched with one another to form a well-defined boundary on substrate 220. All piezoelectric material which is not in the active regions between electrodes 205 and 215 has been removed. The acoustic oscillation is now better confined to the resonator regions, and the medium that previously supported lateral wave motion between the two resonator cavities has been eliminated.

It should be realized that complete removal of the material may not be necessary to achieve the desired improvement in isolation. Alternatively, only a portion of the piezoelectric material not within the active region between the electrodes may be removed. Also, in some cases a designer may need to have planar surfaces for interconnect, or may desire to protect lower layers of the device (i.e., metal film, substrate) exposed during etch. To accomplish this, "back-filling" is performed in a void created by the removal of piezoelectric material. This void is then back filled with a material different from the removed piezoelectric material. Further, if additional isolation is required, the etching of material can be continued beyond the piezoelectric layer into the substrate in certain regions. However, care must be taken to preserve electrical interconnects.

Figure 6A:
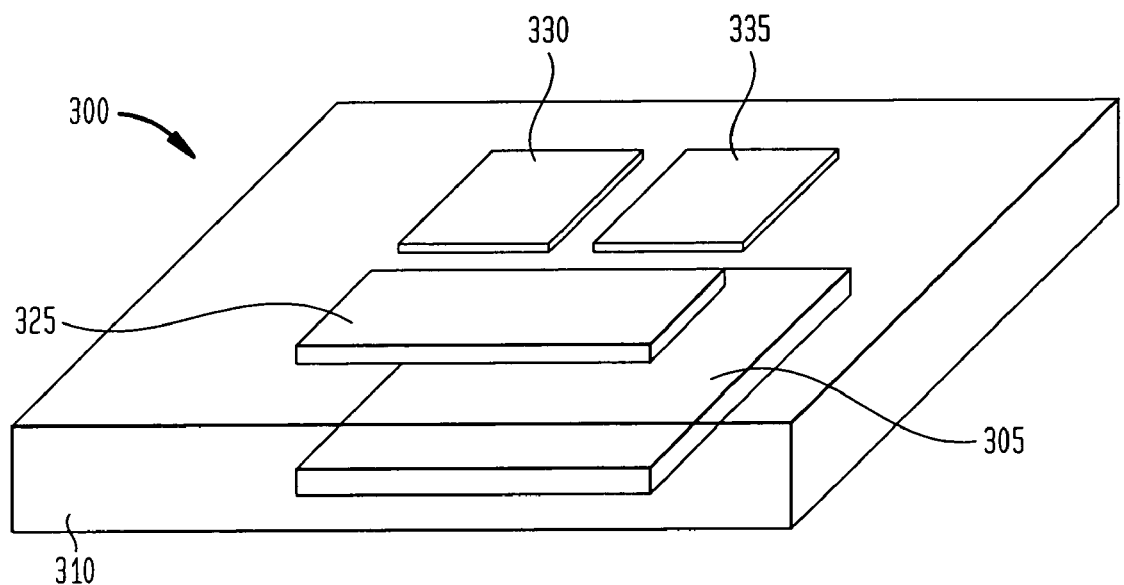
FIGS. 6A and 6B illustrates one type of acoustic resonator device before and after the trenching process.
Figure 6B:
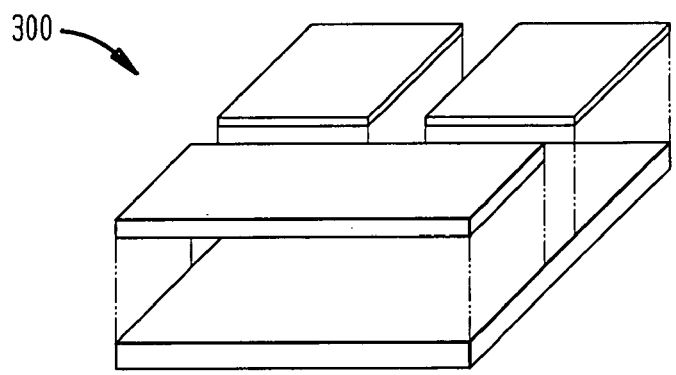

FIGS. 6A and 6B illustrates one type of acoustic resonator device before and after the trenching process. Referring to FIG. 6A, there is illustrated a T-Cell of a thin film resonator (TFR) device 300. It could for example be constructed to function as an RF bandpass filter for wireless communication. This is a similar device to that illustrated in FIG. 4, but adds a shunt resonator cavity (defined by the area encompassing electrodes 325 and 305 sandwiching piezoelectric layer 310 therebetween) in parallel to the series resonator cavities (defined by the area between electrodes 330 and 305 and between electrodes 335 and 305). Similar to FIG. 4, the un-patterned/un-etched portions of piezoelectric layer 310 which are not a part of the resonator cavities support the propagation of lateral waves therethough. However, as illustrated in FIG. 6B, after trenching the TFR device 300 exhibits well-defined boundaries, confining the acoustic energy to the three resonator regions. Therefore, performing the trenching process after device fabrication in accordance with the preferred embodiment provides an isolation method which limits the degradation of acoustic resonator device performance due to lateral loss of acoustic energy and/or disruption caused by acoustic inference between neighboring device.

Figure 7:
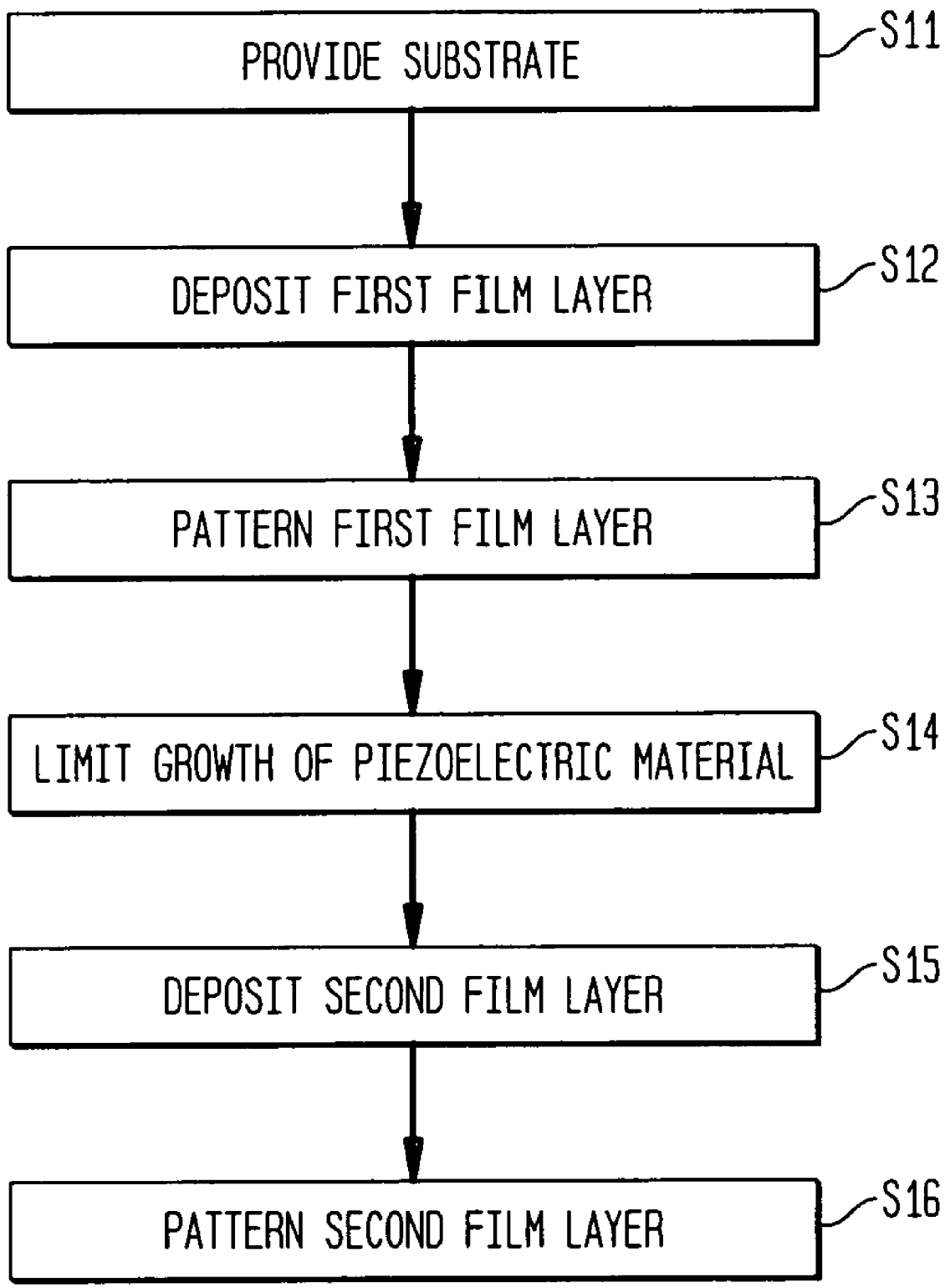
FIG. 7 illustrates an isolation method in accordance with a second embodiment of the present application.

FIG. 7 illustrates a method for isolating an acoustic resonator device in accordance with a second embodiment of the present invention. Steps S11-S13 are identical to steps S1-S3 outlined in FIG. 2. However, instead of isolating the acoustic resonator device after fabrication by removing piezoelectric material which is not between electrodes 205 and 215, the growth of the piezoelectric material is limited during device fabrication in Step S14. Specifically, and prior to deposition of the piezoelectric material, a masking layer is formed, similar to that previously described above in regards to the first embodiment. This masking layer can be a mechanical shadow mask such as employed when one spray paints through a stencil. Using a more conventional lithographic thin-film methodology, one would use a photo resist underneath the film to be patterned this time. As is well known, this resist can be removed after subsequent film deposition and it will "lift-off" any film on its surface leaving only the material that was deposited away from resist covered surfaces. Particularly, the masking layer is formed to delineate "open" regions (where the piezoelectric material will be deposited within the vacuum chamber on the substrate's surface) and "masked" regions (where the piezoelectric material will be deposited within the vacuum chamber on the mask's surface). Subsequent removal of the mask, and thus the material overlying it, leaves behind individual islands, or "pedestals" of active piezoelectric material.

Following piezoelectric deposition within the vacuum chamber and subsequent removal of the mask by solvents, the second metal film is deposited and patterned (Steps S15 and S16) to obtain an acoustic resonator device which looks substantially identical to that shown in FIGS. 5 and 6B. Accordingly, and somewhat similar to the first embodiment, the acoustical energy is better confined to the resonator regions, and any medium which would support lateral wave motion between the resonator cavities has been eliminated in advance.

Figure 8:
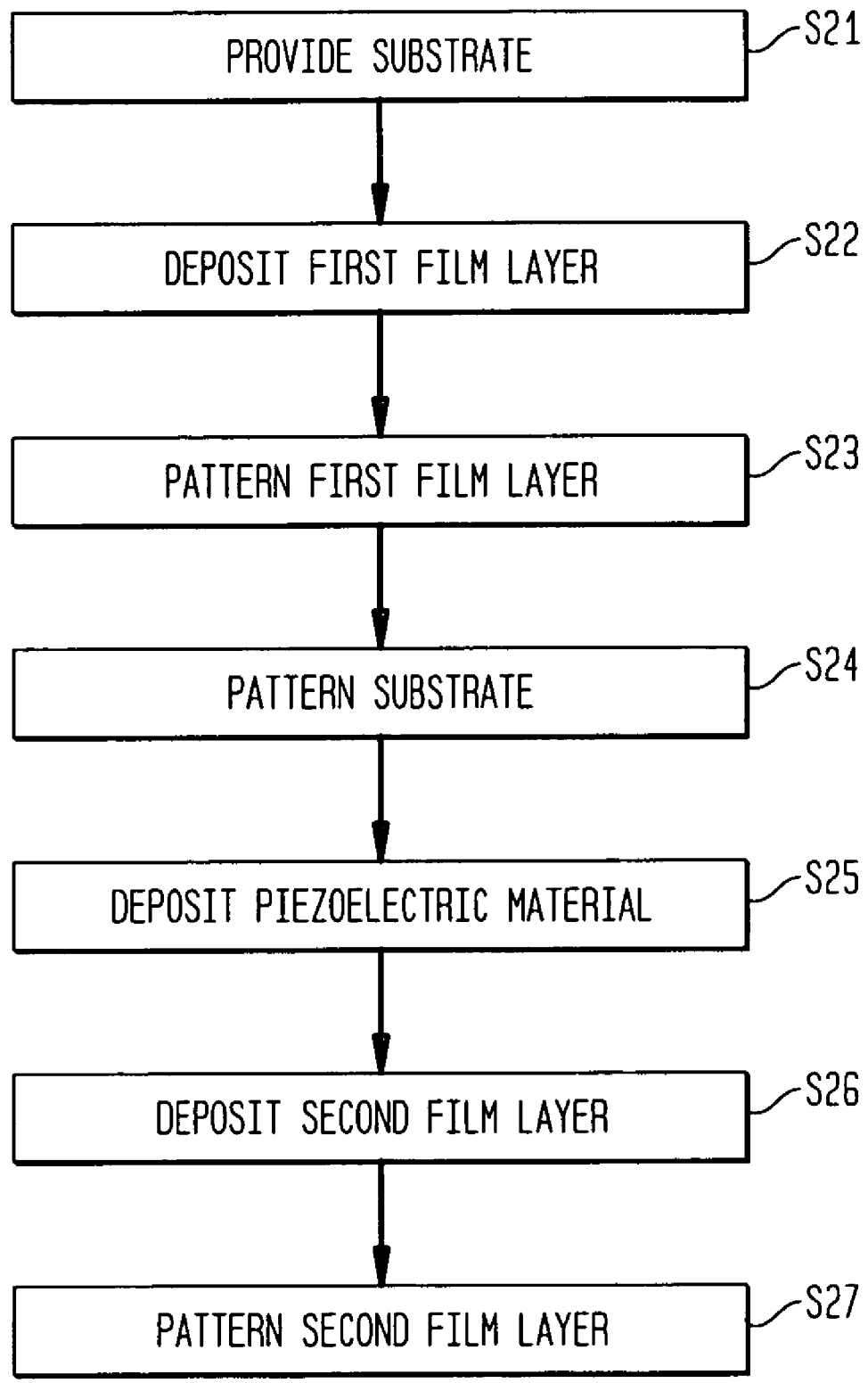
FIG. 8 illustrates an isolation method in accordance with a third embodiment of the present application.

FIG. 8 illustrates a method for isolating an acoustic resonator device in accordance with a third embodiment of the present invention. Unlike the first two embodiments, where there is no piezoelectric material surrounding the discrete resonator structures (it has either been removed by etching or was not deposited there due to masking), the third embodiment provides a method which alters the piezoelectric effect in these regions. This technique involves locally affecting the crystalline orientation of a to be deposited piezoelectric layer, which can be done by patterning the substrate surface, for example.

The intensity of the piezoelectric effect is quantified in terms of the material's "coupling constant" or $K^2$, which represents the fraction of electrical energy that is converted to acoustic energy by the piezoelectric action. It is known in the art that the value of $K^2$ declines rapidly with a decline in average crystalline orientation. Generally, a strong longitudinal piezoelectric response will be obtained only if a significant fraction of a piezoelectric crystals' "C" axes (i.e., for AlN's hexagonal crystal having A, B and C axes) grow perpendicular to the substrate's surface. If, during film growth, an insufficient fraction of crystals achieve this orientation, the piezoelectric material, although chemically identical to the well-oriented material, will cease to exhibit a piezoelectric response. The mis-oriented crystal grains produce strains in random directions and there is a zero sum to the piezoelectricity.

The piezoelectric effect, and therefore the performance of the TFR, is thus strongly affected by the orientation of the piezoelectric crystals. The crystalline orientation, in turn, is highly sensitive to the surface upon which the material is grown. The third embodiment leverages this sensitivity to substrate surface structure by pre-patterning the substrate into regions where the material will grow with well-oriented crystalline structure and those where it will grow with poor orientation. In this embodiment, the crystal structure is "disrupted" in regions outside the discrete resonator structures, rendering those regions incapable of transducing waves, mechanically different than the oriented material such that an acoustic reflection will occur, and if disrupted or altered enough (such that for example crystal morphology is strongly affected) of even transmitting an acoustic wave.

Referring to FIG. 8, after obtaining the substrate (Step S21), a first metal film is deposited (Step S22) and patterned (Step S23) as discussed previously with respect to the first and second embodiments. Thereafter, the substrate is patterned so as to locally alter the substrate surface (Step S24). Specifically, the substrate is subjected to a lithographic process utilizing a masking material, similar to that described above to pattern the metal films and/or piezoelectric material. This pattern, however, is used to define regions on the substrate which will be selectively altered to discourage oriented piezoelectric material growth. Such alterations may involve roughening of the substrate surface (by argon ion bombardment or wet chemical etching, for example), or the deposition of a thin film (sputtered or chemical vapor deposited (CVD) $SiO_2$, for example) which is a material known not to support oriented piezoelectric growth. Following this surface preparation, the masking material (photo resist) is removed by a solvent.

During the subsequent deposition of piezoelectric film in Step S24, that piezoelectric material deposited on an un-altered surface or "pristine region" will form well-oriented crystals exhibiting a significant piezoelectric effect. However, material deposited on the "treated" regions of the substrate will form poorly-oriented material. This poorly-oriented material has the same chemical components of the well-oriented material, but lacks the crystal structure required to exhibit a useful piezoelectric effect. Further, as compared to the well-oriented material, it has different mechanical properties such as sound speed, and can have significantly different morphology (i.e., a less dense and/or more grainy structure). Thereafter, the second metal film is deposited and patterned (Steps S26 and S27) to define acoustic resonator devices in the well-oriented, piezoelectrically-active regions.

Referring to FIG. 4, by using the method in accordance with the third embodiment, the piezoelectric material of layer 210 between the metal electrodes 205 and 215 and on the substrate 220 is well-oriented, so as to support the piezoelectric response which is characteristic of the acoustic resonator device 200. However, due to the pre-treatment of the substrate surface, the piezoelectric material of layer 210 which is not sandwiched between electrodes 205 and 215 lacks the crystal structure required to exhibit a useful piezoelectric effect. This material thus provides in-situ acoustic isolation, limiting the creation of and propagation of undesired lateral waves between resonator cavities.

The invention being thus described, it will be obvious that the same may be varied in many ways. Such variations are not to be regarded as a departure from the spirit and scope of the invention, and also to modifications as would be obvious to one skilled in the art or intended to be included within the scope of the following claims.

What is claimed is:

1. A method of producing an acoustic resonator device, comprising:
    depositing a first metal film directly on a substrate;
    patterning said first metal film to form an electrode region;
    after patterning depositing piezoelectric material on said electrode region to form a single, continuous piezoelectric layer;
    depositing a second metal film on said single piezoelectric layer;
    patterning said second metal film to form a plurality of spaced apart electrodes; and
    removing the piezoelectric material from a region of the piezolelectric layer underneath a spaced apart region between said spaced part electrodes by a selective etching process to limit lateral propagation losses to un-etched regions of the acoustic resonator device, said removing step being performed after said second metal film is patterned.

2. The method of claim 1, wherein said piezoelectric material is selected from the group consisting of AlN, ZnO and CdS.

3. The method of claim 1, wherein said first and second metal films are formed by lithographic patterning of Al metal or other conductors.

4. The method of claim 1, wherein said substrate is formed as a plurality of acoustic reflecting layers on a substrate formed from one of a silicon, quartz or glass wafer.

5. A method of isolating an acoustic resonator device, comprising:
    depositing and patterning a first metal film directly on a substrate;
    depositing piezoelectric material on said patterned first metal film to form a single, continuous piezoelectric layer;
    depositing a second metal film on said single piezoelectric layer;
    patterning the second metal film to form a plurality of spaced apart electrodes; and
    removing the piezoelectric material from said single piezoelectric layer underlying a spaced apart region between the spaced apart electrodes with a selective etching process to limit propagation of energy in lateral modes, said removing step being performed after said second metal film is deposited on said single piezoelectric layer and patterned.

6. The method of claim 5, wherein at least some of the substrate surface is removed by selective etching.

7. The method of claim 5, wherein at least some of the removed piezoelectric material forms a void which is back filled with a different material.

* * * * *